(12) United States Patent
Huang et al.

(10) Patent No.: US 10,157,885 B2
(45) Date of Patent: Dec. 18, 2018

(54) PACKAGE STRUCTURE HAVING MAGNETIC BONDING BETWEEN SUBSTRATES

(71) Applicant: Taiwan Semiconductor Manufacturing Co., Ltd., Hsinchu (TW)

(72) Inventors: Peter Yu-Fei Huang, Pleasanton, CA (US); Richard Burton Cassidy, II, Los Gatos, CA (US); Chaochieh Tsai, Cupertino, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/223,078

(22) Filed: Jul. 29, 2016

(65) Prior Publication Data

US 2018/0033773 A1    Feb. 1, 2018

(51) Int. Cl.

| H01L 29/40 | (2006.01) |
|---|---|
| H01L 25/065 | (2006.01) |
| H01L 25/00 | (2006.01) |
| H01L 23/00 | (2006.01) |
| H01L 23/498 | (2006.01) |
| H01L 21/78 | (2006.01) |

(Continued)

(52) U.S. Cl.
CPC .... *H01L 25/0657* (2013.01); *H01L 21/76898* (2013.01); *H01L 21/78* (2013.01); *H01L 22/20* (2013.01); *H01L 23/481* (2013.01); *H01L 23/49816* (2013.01); *H01L 23/49827* (2013.01); *H01L 24/05* (2013.01); *H01L 24/09* (2013.01); *H01L 24/13* (2013.01); *H01L 24/14* (2013.01); *H01L 24/16* (2013.01); *H01L 24/81* (2013.01); *H01L 25/0652* (2013.01); *H01L 25/50* (2013.01); *H01L 2224/10165* (2013.01); *H01L 2924/01026* (2013.01); *H01L 2924/01027* (2013.01); *H01L 2924/01028* (2013.01)

(58) Field of Classification Search
CPC ..... H01L 25/0657; H01L 25/50; H01L 24/09; H01L 23/49827; H01L 21/78; H01L 22/20; H01L 23/49816; H01L 2924/01028; H01L 2924/01026; H01L 2924/01027; H01L 24/81; H01L 24/13; H01L 21/76898; H01L 23/481; H01L 24/16; H01L 24/05; H01L 24/14; H01L 24/17; H01L 25/0652; H01L 23/544
USPC ................................ 257/621, 698, 777, 737
See application file for complete search history.

(56) References Cited

U.S. PATENT DOCUMENTS

| 7,564,115 B2 | 7/2009 | Chen et al. |
|---|---|---|
| 7,633,165 B2 | 12/2009 | Hsu et al. |

(Continued)

*Primary Examiner* — Shouxiang Hu
(74) *Attorney, Agent, or Firm* — McClure, Qualey & Rodack, LLP

(57) ABSTRACT

A package structure and method for forming the same are provided. The package structure includes a first die, and the first die includes a first magnetic pad formed over a first substrate. The package structure includes a second die, and the second die includes a second magnetic pad formed over a second substrate. The package structure also includes a hybrid bonding structure formed between the first die and the second die of the second wafer. The hybrid bonding structure includes a magnetic bonding structure which is made of the first magnetic pad and the second magnetic layer.

20 Claims, 16 Drawing Sheets

(51) Int. Cl.
*H01L 21/66* (2006.01)
*H01L 23/48* (2006.01)
*H01L 21/768* (2006.01)

(56) References Cited

U.S. PATENT DOCUMENTS

| | | |
|---|---|---|
| 7,825,024 B2 | 11/2010 | Lin et al. |
| 7,830,011 B2 * | 11/2010 | Nomoto .................. H01L 23/12 |
| | | 257/758 |
| 7,973,413 B2 | 7/2011 | Kuo et al. |
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,426,961 B2 | 4/2013 | Shih et al. |
| 8,592,952 B2 * | 11/2013 | Jo ......................... H01L 23/481 |
| | | 257/621 |
| 8,669,174 B2 | 3/2014 | Wu et al. |
| 8,802,504 B1 | 8/2014 | Hou et al. |
| 8,803,292 B2 | 8/2014 | Chen et al. |
| 8,803,316 B2 | 8/2014 | Lin et al. |
| 9,087,821 B2 * | 7/2015 | Lin ....................... H01L 23/481 |
| 9,402,315 B2 * | 7/2016 | Chun ....................... H05K 1/18 |
| 2014/0001645 A1 | 1/2014 | Lin et al. |
| 2014/0225258 A1 | 8/2014 | Chiu et al. |
| 2014/0252572 A1 | 9/2014 | Hou et al. |
| 2015/0130075 A1 * | 5/2015 | Ji ......................... H01L 23/562 |
| | | 257/774 |
| 2015/0287697 A1 | 10/2015 | Tsai et al. |
| 2015/0348872 A1 | 12/2015 | Kuo et al. |

* cited by examiner

PACKAGE STRUCTURE HAVING MAGNETIC BONDING BETWEEN SUBSTRATES

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

New packaging technologies, such as package on package (PoP), have begun to be developed, in which a top package with a device die is bonded to a bottom package, with another device die. By adopting the new packaging technologies, various packages with different or similar functions are integrated together.

Although existing package structures and methods of fabricating package structures have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
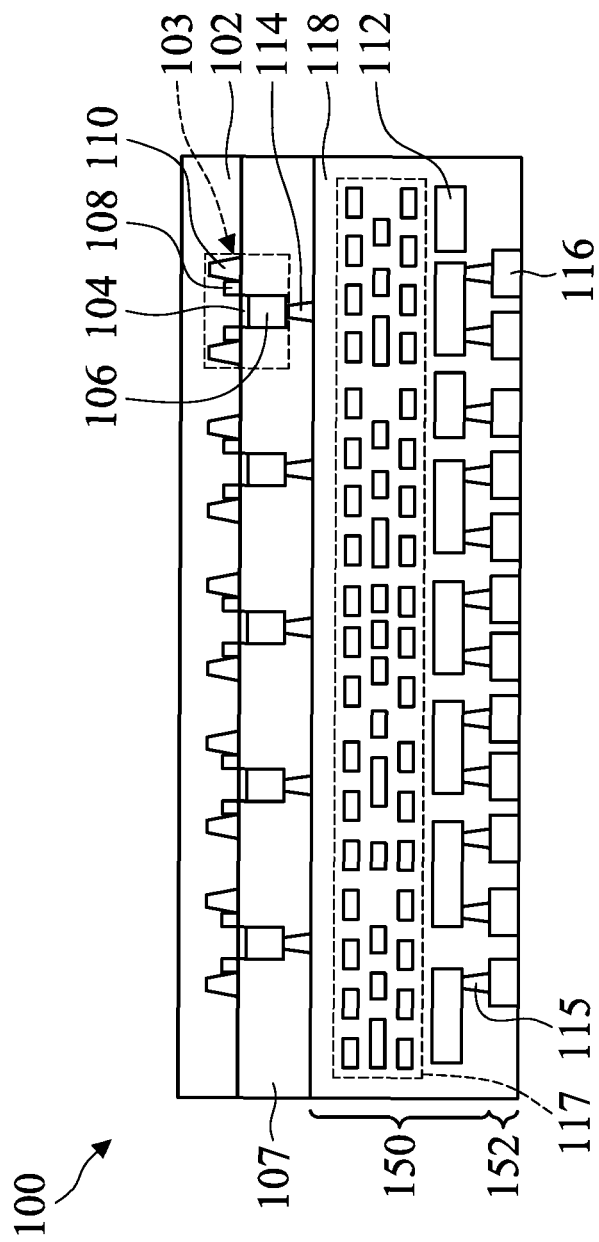
FIGS. 1A-1I show cross-sectional representations of various stages of forming a package structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a package structure and method for forming the same are provided. FIGS. 1A-1I show cross-sectional representations of various stages of forming a package structure 30, in accordance with some embodiments of the disclosure.

As shown in FIG. 1A, a first wafer 100 is received. The first wafer 100 includes a first substrate 102. The first substrate 102 may be made of silicon or other semiconductor materials. Alternatively or additionally, the first substrate 102 may include other elementary semiconductor materials such as germanium. In some embodiments, the first substrate 102 is made of a compound semiconductor such as silicon carbide, gallium arsenic, indium arsenide, or indium phosphide. In some embodiments, the first substrate 102 is made of an alloy semiconductor such as silicon germanium, silicon germanium carbide, gallium arsenic phosphide, or gallium indium phosphide. In some embodiments, the first substrate 102 includes an epitaxial layer. For example, the first substrate 102 has an epitaxial layer overlying a bulk semiconductor.

A dielectric layer 107 is formed over the substrate 102. The first dielectric layer 107 is made of oxide, nitride or a combination thereof. In some embodiments, the first device regions 103 are formed in first wafer 100 in a front-end-of-line (FEOL) process. The first device regions 103 may form various N-type metal-oxide semiconductor (NMOS) and/or P-type metal-oxide semiconductor (PMOS) devices, such as transistors or memories, and the like, which are interconnected to perform one or more functions. Other devices, such as capacitors, resistors, diodes, photo-diodes, fuses, and the like may also be formed on the first substrate 102.

Each device regions 103 includes a first gate dielectric layer 104 and a first gate electrode layer 106 on the first gate dielectric layer 104. The first gate dielectric layer 104 and the first gate electrode layer 106 are formed in the first dielectric layer 107. The first source/drain (S/D) structures 108 and the first isolation structures 110, such as shallow trench isolation (STI) structures are formed in the first substrate 102. The first device regions 103 shown in FIG. 1A are merely examples, and other structures may be formed in the first device regions 103.

A first interconnect structure 150 is formed over the first substrate 102. A first contact via 114 is formed on the first gate electrode layer 106 and is electrically connect to the first interconnect structure 150. The first interconnect structure 150 is formed over the first device regions 103. The first interconnect structure 150 includes first conductive lines 112 and first vias 115 and first metallization layers 117. The first vias 115 may also connect the first conductive lines 112 in different metallization layers. The first conductive lines 112 provide vertical connection while the first vias 115 provide vertical connection between metal lines in different metal layers. In some embodiments, the first interconnect structure 150 is formed in a back-end-of-line (BEOL) process. A first bonding structure 152 is formed over the first interconnect structure 150. The first bonding structure 152 includes a first metal layer 116 embedded in the first insulating layer 118. Should give a reference numeral for element in red frame The first metal layer 116 is made of copper (Cu), copper alloy, aluminum (Al), aluminum alloys, or a combination thereof. In some embodiments, if the first metal layer 116 is made of a metal which is easy to diffuse, such as copper, a diffusion barrier layer (not shown) is needed. The diffusion barrier layer may be made of silicon nitride (SiN), silicon oxynitride (SiON), titanium nitride (TiN), tantalum nitride (TaN) or aluminum nitride (AlN). In some embodiments, the first metal layer 116 is made of copper (Cu), and the diffusion barrier layer is made of TaN/Ta bi-layer.

In some embodiments, the first insulating layer 118 is made of oxide, such as silicon oxide (SiOx). In some other embodiments, the first insulating layer 118 is made of polymer, such as benzocyclobutene (BCB) polymer, polyimide (PI), or polybenzoxazole (PBO). Since polymer is a soft material, it can tolerate more stress resulting from the TSV formed in the subsequent processes, compared to other dielectric materials.

Figure 1B:
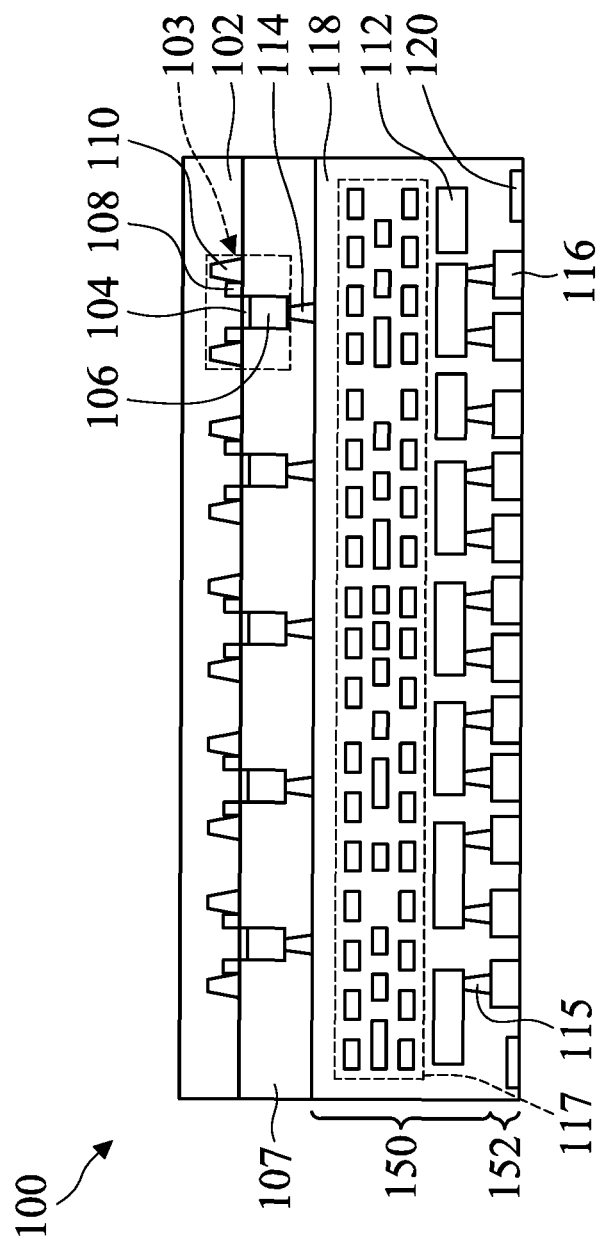

Afterwards, a first magnetic pad 120 is formed in the first insulating layer 118, as shown in FIG. 1B, in accordance with some embodiments of the disclosure. The first magnetic pad 120 is formed at the corner region or the peripheral region of the first bonding structure 152. In other words, the first magnetic pad 120 is embedded in the first insulating layer 118. The first magnetic pad 120 is used to perform an alignment function. In some embodiment, the first magnetic pad 120 is not electrically connected with other components in first interconnect structure. The first magnetic pad 120 does not affect the electrical function of the devices in the first device regions 103.

The first magnetic pad 120 is made of ferromagnetic materials. In some embodiments, the first magnetic pad 120 is made of iron (Fe), cobalt (Co), nickel (Ni) or a combination thereof.

A trench (not shown) is firstly formed in the first insulating layer 118 and a magnetic material is formed in trench and over the first insulating layer 118. Afterwards, the excess magnetic material out of the trench is removed to form the magnetic pad 120 by a polishing process, such as chemical mechanical polishing (CMP) process. The trench is formed by an etching process. The first magnetic pad 120 is formed by a deposition process, such as a chemical vapor deposition (CVD) process, a physical vapor deposition (PVD) process, or another applicable process. In some embodiments, the first magnetic pad 120 is formed by a physical vapor deposition (PVD) process. The PVD process is performed at a temperature of 200 degrees to about 300 degrees. When the PVD process is performed within the above temperature range, the devices in the device regions 103 may not be damaged by the PVD process.

After the deposition process, a polishing process is performed on the first magnetic material to expose the top surface of the first metal layer 116. As a result, the top surface of the first metal layer 116 is leveled with the top surface of the first magnetic pad 120. In some embodiments, the polishing process is the chemical mechanical polishing (CMP) process.

After the first magnetic pad 120 is formed, the first magnetic pad 120 is put near an Magnetic Resonance Imaging (MRI) device. As a result, the first magnetic pad 120 is magnetized to have a first polarity, such as N polarity or S polarity. In some embodiments, after the deposition process, the first magnetic pad 120 may be magnetized in-situ in the deposition chamber without being transferred to another chamber to avoid the chance of pollution.

Figure 1C:
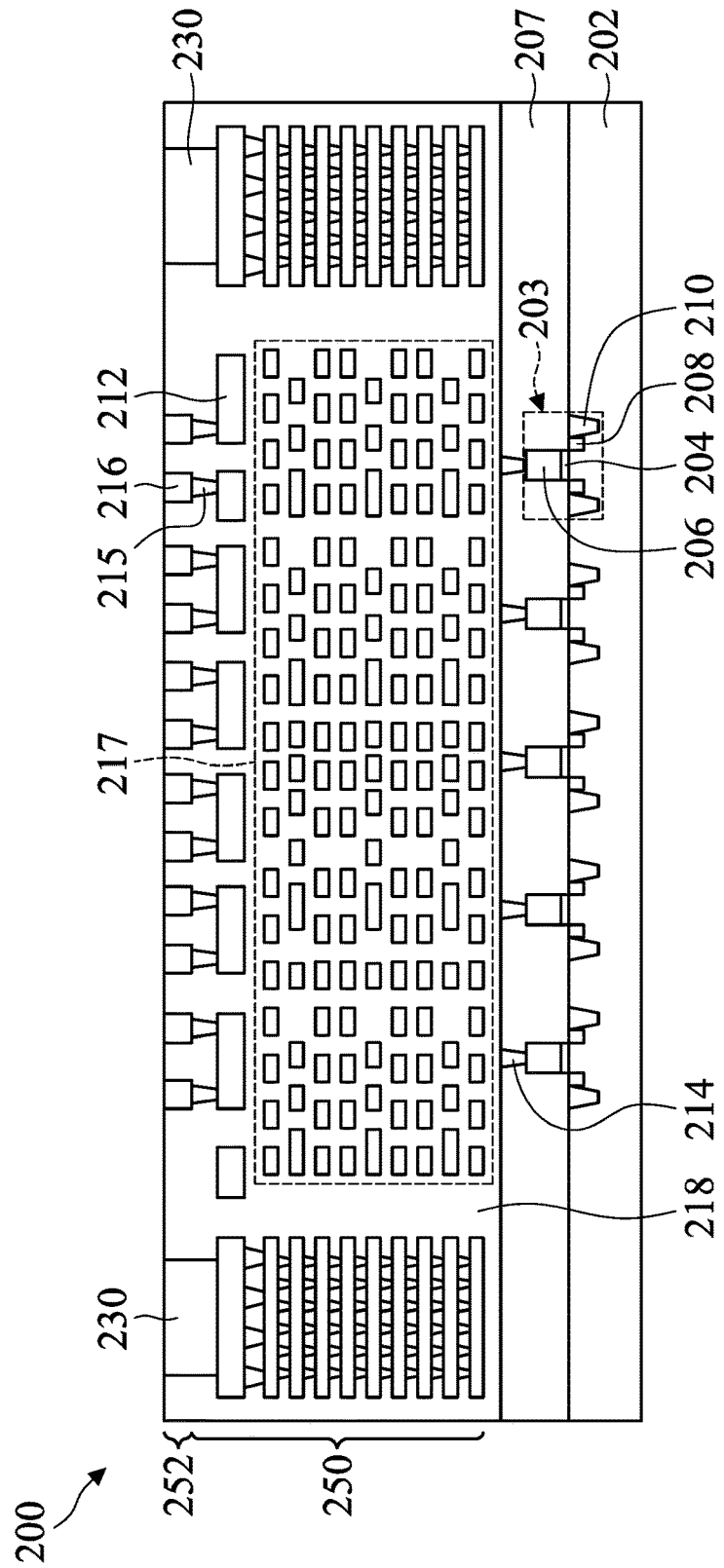

Afterwards, a second wafer 200 is received, as shown in FIG. 1C, in accordance with some embodiments of the disclosure. The second wafer 200 is similar to the first wafer 100. The second wafer 200 includes a second substrate 202 and the second device regions 203.

The second substrate 202 is similar to the first substrate 102. The second dielectric layer 207 is similar to the first dielectric layer 107. The second device regions 203 are similar to the first device regions 103. The second device regions 203 include a second gate dielectric layer 204 and a second gate electrode layer 206 on the second gate dielectric layer 204. The second source/drain (S/D) structures 208 and the second isolation structures 210, such as shallow trench isolation (STI) structures, are formed in the second substrate 202.

A second interconnect structure 250 is formed over the second substrate 202. A second contact via 214 is formed over the second device regions 203 and is electrically connect to the second interconnect structure 250. The second interconnect structure 250 is formed over the second device regions 203. The second interconnect structure 250 includes second conductive lines 212 and second vias 215 and second metallization layers 217.

A second bonding structure 252 is formed over the second interconnect structure 250. The second bonding structure 252 includes a second metal layer 216 embedded in a second insulating layer 218. The second metal layer 216 is made of copper (Cu), copper alloy, aluminum (Al), aluminum alloys, or a combination thereof. In some embodiments, the second insulating layer 218 is made of oxide, such as silicon oxide (SiOx).

In addition, the second bonding structure 252 further includes a metal pad 230 over the second substrate 202. The metal pad 230 is used to transfer the signals of the devices in the device regions 203 to the outer devices. In some embodiments, the metal pad 230 is made of metal materials, such as copper (Cu), copper alloy, aluminum (Al), aluminum alloys, or a combination thereof. The top surface of the metal pad 230 and the top surface of the second metal layer 216 are substantially coplanar.

Figure 1D:
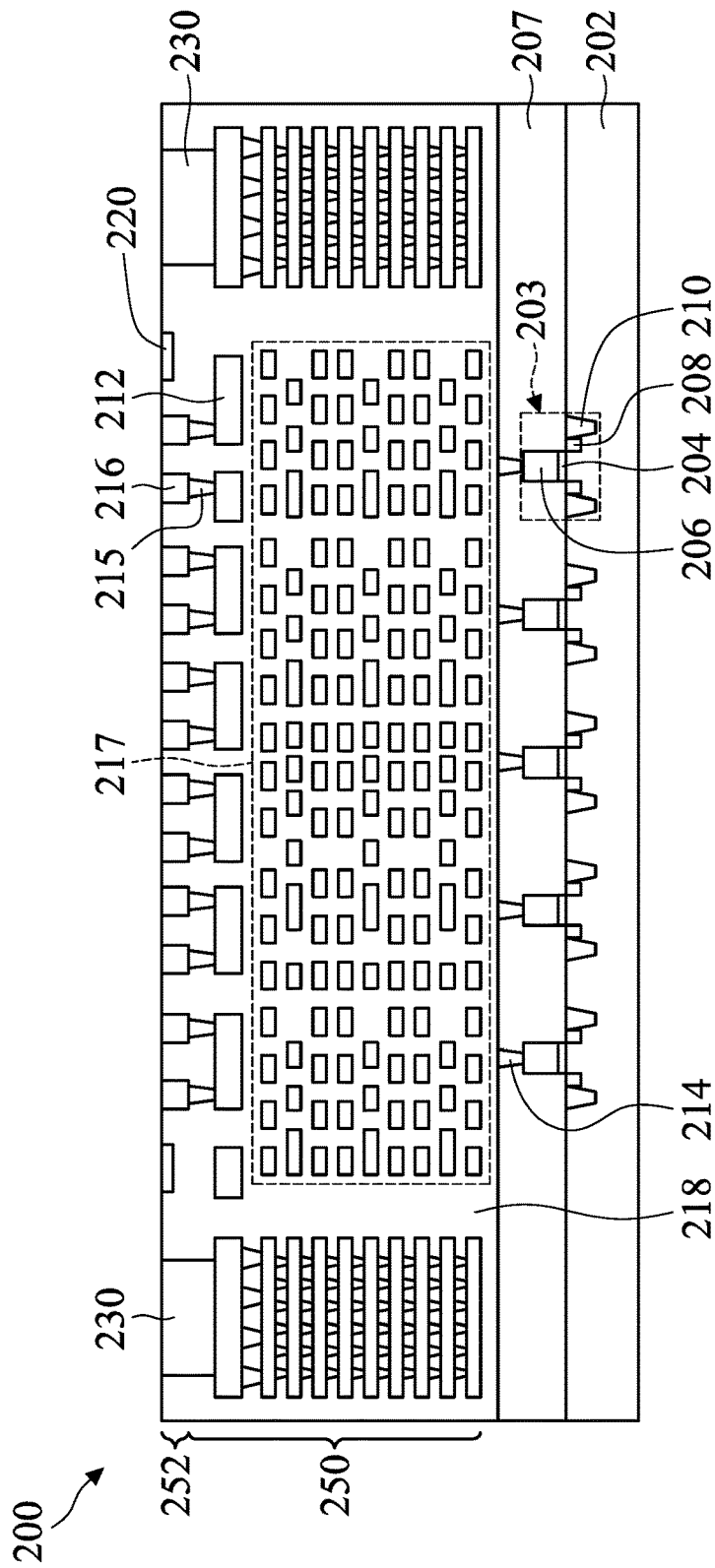

Afterwards, a second magnetic pad 220 is formed in the second insulating layer 218, as shown in FIG. 1D, in accordance with some embodiments of the disclosure. The second magnetic pad 220 is formed at the corner region or the peripheral region of the second bonding structure 252. The second magnetic pad 220 is embedded in the second insulating layer 218. The second magnetic pad 220 is used to perform an alignment function. The second magnetic pad 220 does not affect the electrical function of the devices in the second device regions 203.

The formation process of the second magnetic pad 220 is similar to that of the first magnetic pad 120. The difference between the first magnetic pad 120 and the second magnetic pad 220 is that the second magnetic pad 220 is magnetized to have a second polarity which is opposite to the first polarity of the first magnetic pad 120. In some embodiments, the first magnetic pad 120 is magnetized to have N polarity, and the second magnetic pad 220 is magnetized to have P polarity. In some other embodiments, the first magnetic pad 120 is magnetized to have P polarity, and the second magnetic pad 220 is magnetized to have N polarity.

In some embodiments, the shape and the size of the first magnetic pad 120 is the same as the second magnetic pad 220. In some embodiments, there are the same number of first magnetic layers 120 in the first wafer as there are second magnetic layers 220.

Figure 2A:
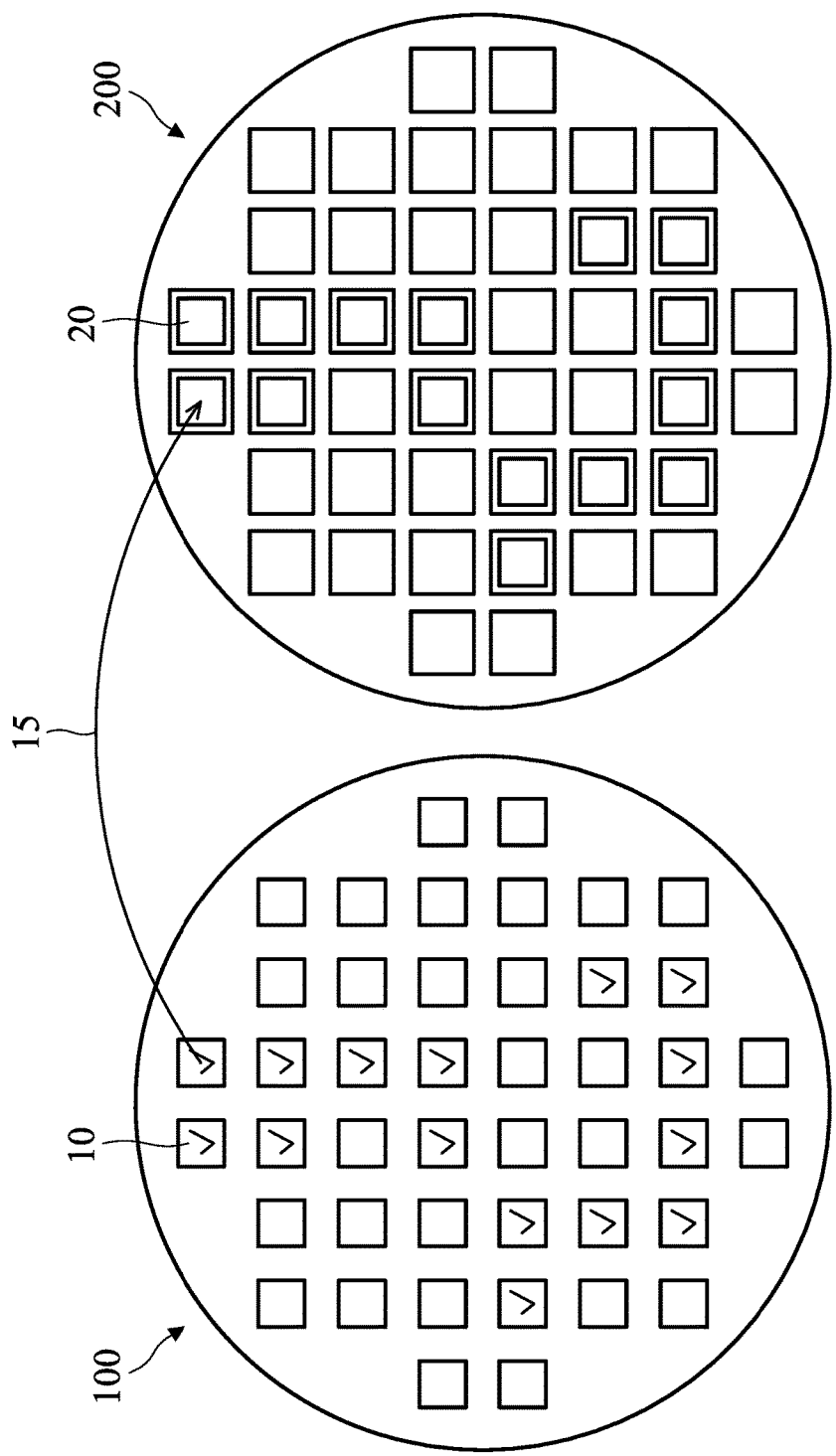
FIG. 2A shows a top-view representation of the first wafer 100 and the second wafer, before a bonding process, in accordance with some embodiments of the disclosure.

FIG. 2A shows a top-view representation of the first wafer 100 and the second wafer 200, before a bonding process, in accordance with some embodiments of the disclosure. The first wafer 100 includes a number of first dies 10, and the second wafer 200 includes a number of second dies 20. Before performing the bonding process, a function test, which is a quality test, is performed on the first dies 10 to check the proper functioning of the first dies 10. If some of the first dies 10 pass the function test, the dies 10 will be marked as good first dies 10. For example, some marks, like a tick, are shown on the top surface of the first dies 10. Like the first wafer 100, the function test is also performed on the second dies 20. Therefore, some of the second dies 20 are marked as good dies 20.

Afterwards, a pick/put machine 15 is used to pick each of the good first dies 10. Afterwards, each of the good dies 10 is moved to a position which is on each of the top of the good second dies 20. More specifically, the good first dies 10 are put over the second dies 20 of the second wafer 200. Accordingly, a die-on-wafer configuration is obtained. It should be noted that the size of each first die 10 is smaller than the size of each second die 20. Therefore, a portion of the top surface of each second die 20 is exposed.

Figure 1E:
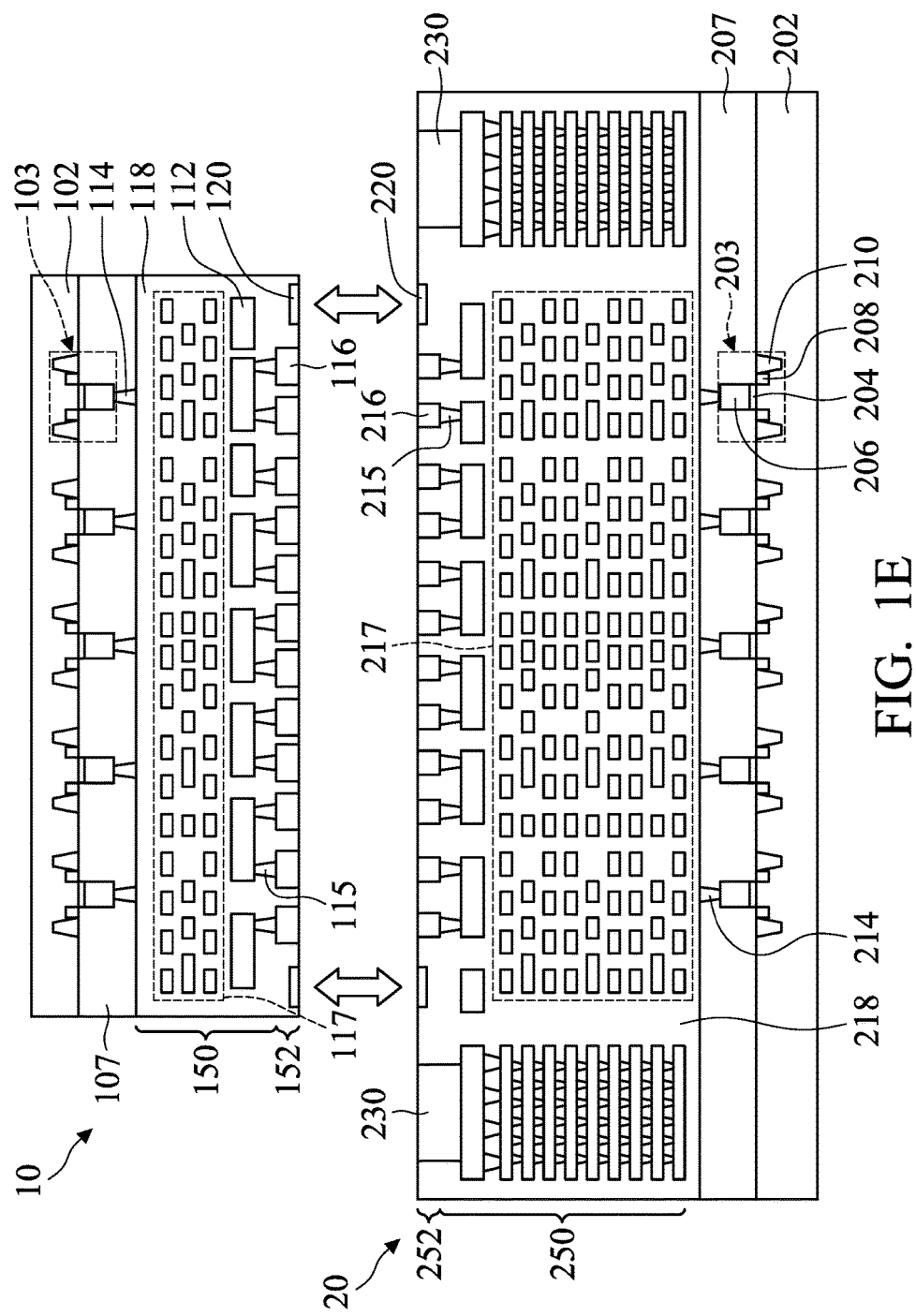

As shown in FIG. 1E, before the bonding process, the top surface of the first die 10 faces the top surface of the second die 20 or second wafer 200. The first magnetic pad 120 faces the second magnetic pad 220. Since the first magnetic pad 120 has a polarity that is opposite to the polarity of the second magnetic pad 220, the first magnetic pad 120 and the second magnetic pad 220 attract each other by the magnetic force. When the first magnetic pad 120 is moved closer to the second magnetic pad 220, the first magnetic pad 120 is spontaneously attracted to the second magnetic pad 220 via magnetic force.

Because the first magnetic pad 120 is self-aligned to the second magnetic pad 220, the first bonding structure 152 is aligned to the second bonding structure 252. More specifically, the first metal layer 116 is aligned to the second metal layer 216, and the first insulating layer 118 is aligned to the second insulating layer 218. Therefore, the alignment precision is efficiently improved by using the first magnetic pad 120 and the second magnetic pad 220.

Figure 1F:
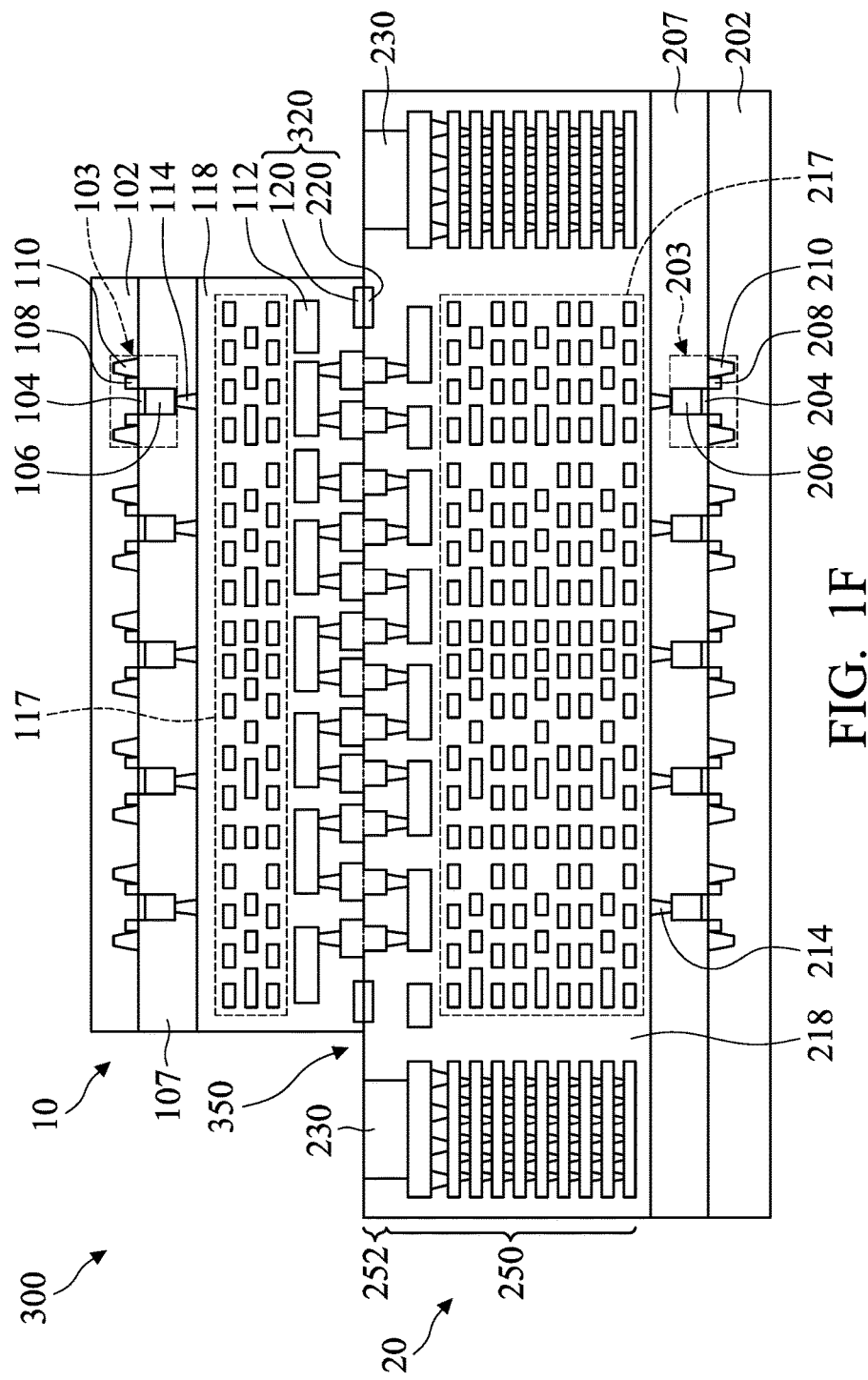

Afterwards, a bonding process is performed to bond the first die 10 to the second die 20 over the second wafer 200 to form a hybrid bonding structure 350 between the first die 10 and the second die 20, as shown in FIG. 1F, in accordance with some embodiments of the disclosure. A die-on-wafer structure 300 is obtained. The die-on-wafer structure 300 is a face-to-face bonding structure because the top of the first gate electrode layer 106 in the device region 103 faces the top of the second gate electrode layer 206 in the device region 203. In some other embodiments, the first die 10 is obtained from the first wafer 100 and the second die 20 is obtained from the second wafer 200. The first die 10 and the second die 20 are separately pre-formed and then a die-to-die bonding structure is formed by bonding the first die 10 to the second die 20.

The hybrid bonding structure 350 includes a metal-to-metal bonding, a non-metal-to-non-metal bonding and a magnetic bonding structure 320. The first magnetic pad 120 is self-aligned to the second magnetic pad 220 to form the magnetic bonding structure 320. The metal-to-metal bonding is formed by bonding the first metal layer 116 and the second metal layer 216, and the non-metal-to-non-metal bonding is formed by bonding the first insulating layer 118 and the second insulating layer 218. During the bonding process, the first metal layer 116 and the second metal layer 216 are melted, and therefore the metal-to-metal bonding may not have a clear metallic interface between the first metal layer 116 and the second metal layer 216. But, the non-metal-to-non-metal bonding may have a clear non-metallic interface between the first insulating layer 118 and the second insulating layer 218.

Before the bonding process, the top surface of the first die 10 and the top surface of the second die 20 of the second wafer 200 are cleaned by a cleaning process to remove some pollution. After the first die 10 and the second die 20 are aligned by the first magnetic pad 120 and the second magnetic pad 220, the bonding process including a heating process is performed on the first die 10 and the second die 20.

In some embodiments, the bonding process is performed in an inert environment filled with a gas such as $N_2$, Ar, He, or a combination thereof. In some embodiments, the heating process (or annealing process) is performed at a temperature in a range from about 200 degrees (° C.) to about 300 degrees (° C.). If the temperature is lower than 200 degrees (° C.), the first metal layer 116 and the second metal layer 216 may not be melt. If the temperature is greater than 300 degrees (° C.), the devices in the first device regions 103 and the second device region 203 may be damaged.

Figure 1G:
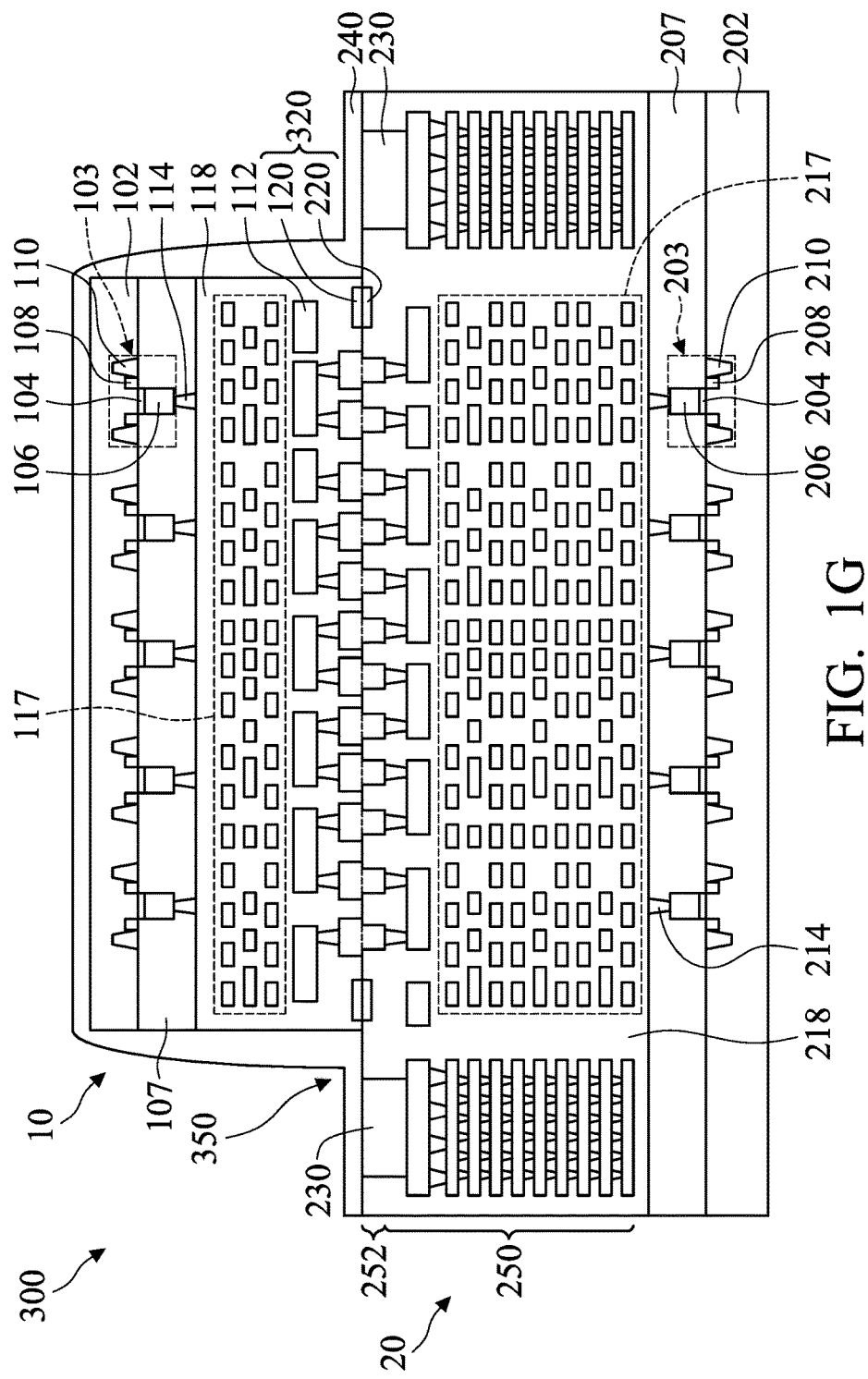

Afterwards, a passivation layer 240 is formed over the bottom surface of the first substrate 102 and the top surface of the metal pad 230, as shown in FIG. 1G, in accordance with some embodiments of the disclosure.

In some embodiments, the passivation layer 240 is made of polybenzoxazole (PBO), benzocyclobutene (BCB), silicone, acrylates, siloxane, or a combination thereof. In some other embodiments, the passivation layer 240 is made of non-organic materials, such as silicon oxide, un-doped silicate glass, silicon oxynitride, solder resist (SR), silicon nitride, HMDS (hexamethyldisilazane).

Figure 1H:
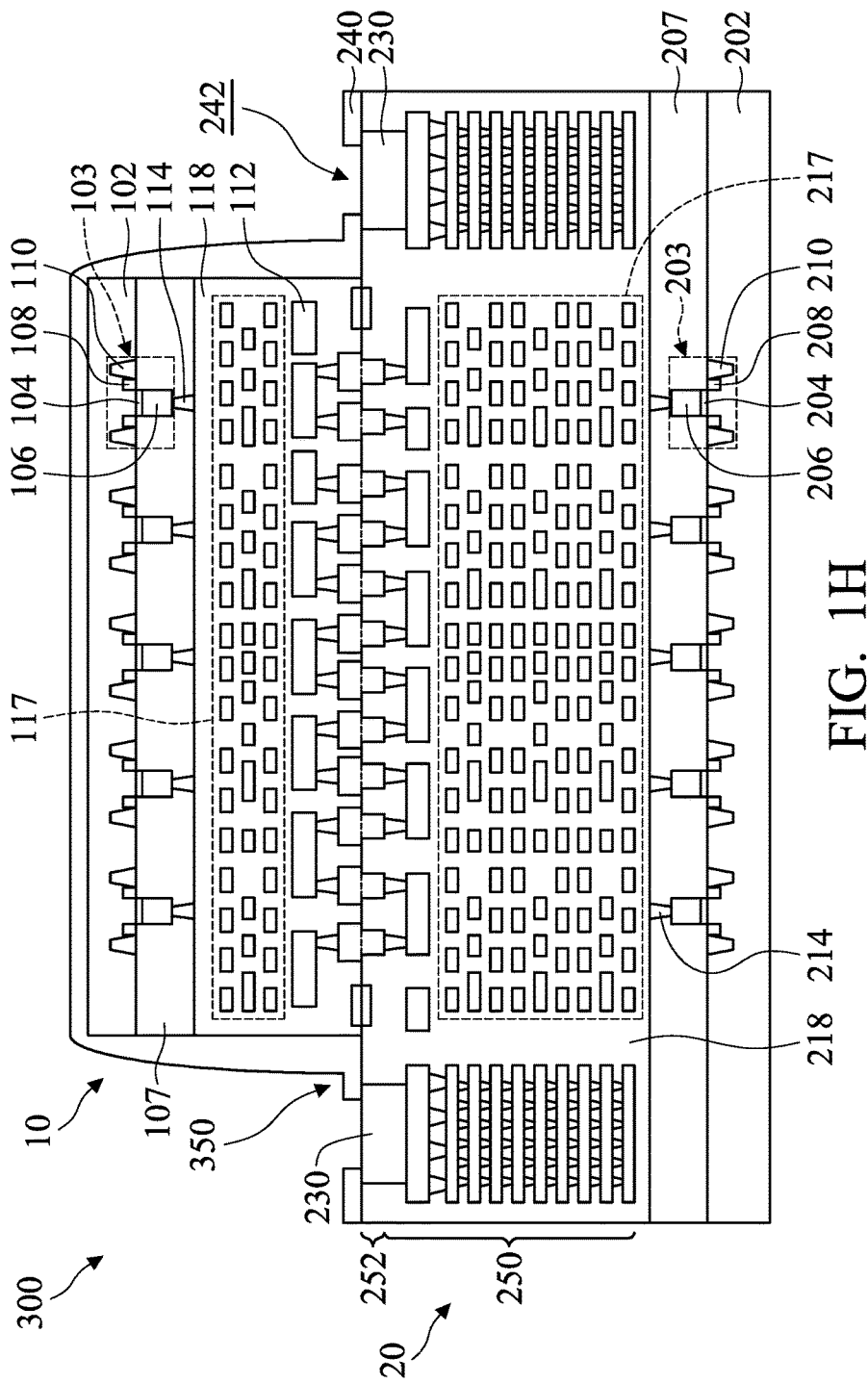

After the passivation layer 240 is formed, a portion of the passivation layer 240 is removed to form an opening 242, as shown in FIG. 1H, in accordance with some embodiments of the disclosure. As a result, the top surface of the metal pad 230 is exposed by the opening 242. In some embodiments, the portion of the passivation layer 240 is removed by an etching process, such as dry etching process or wet etching process.

Figure 1I:
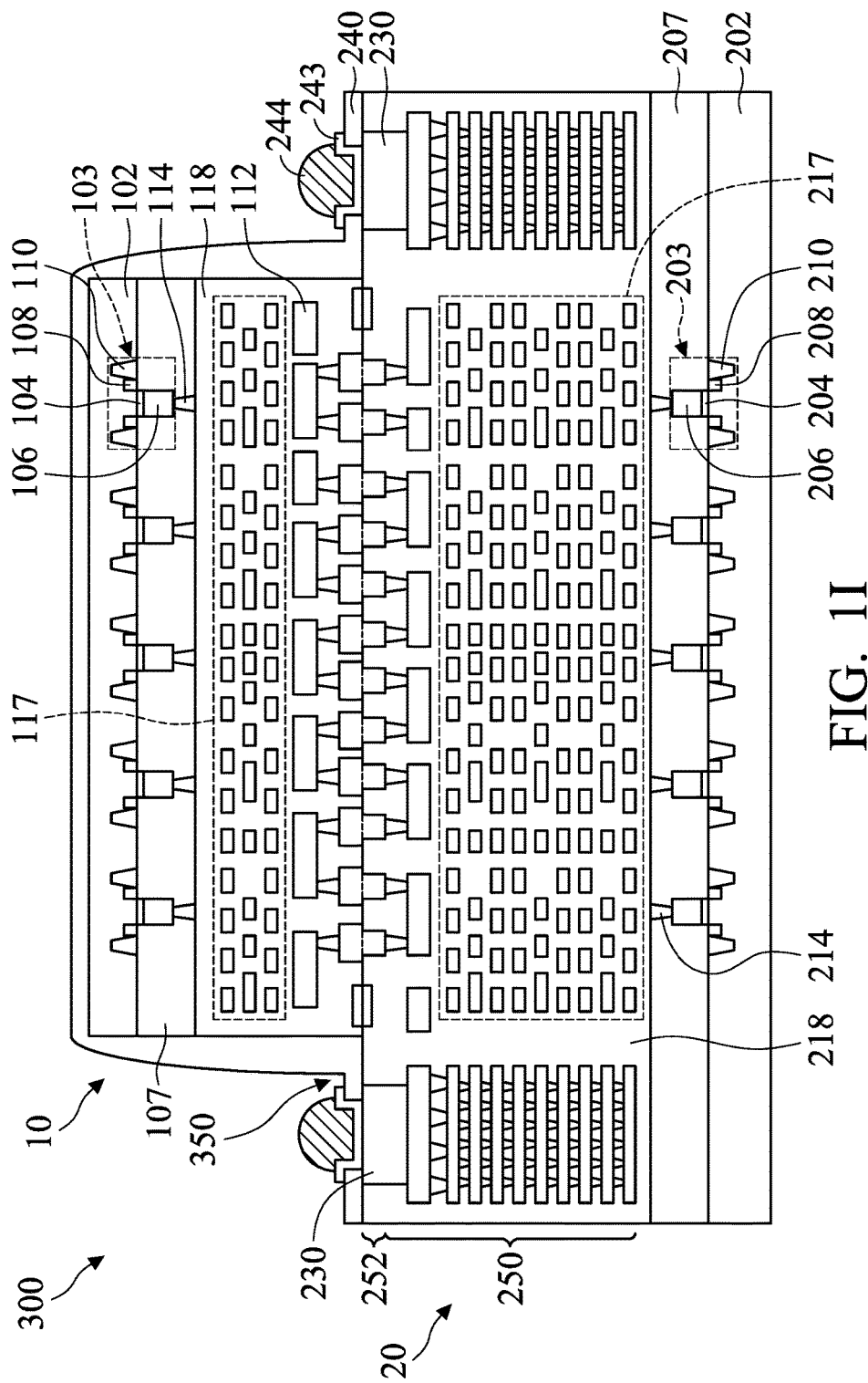

Afterwards, a under bump metallization (UBM) layer 234 and an electrical connector 244 are formed on the metal pad 230, as shown in FIG. 1I, in accordance with some embodiments of the disclosure. The electrical connector 244 is electrically connected to the second interconnect structure 250. The electrical connector 244 is a bump structure. In some embodiments, the electrical connector 244 is used as input/output (I/O) electrical contact. In some embodiments, UBM layer 234 is made of titanium (Ti), titanium nitride (TiN), tantalum nitride (TaN), tantalum (Ta), alloys thereof, or the like. In some embodiments, the electrical connector 244 is made of conductive materials, such as tin (Sn), copper (Cu), gold (Au), silver (Ag), alloys thereof, or other suitable materials.

Figure 2B:
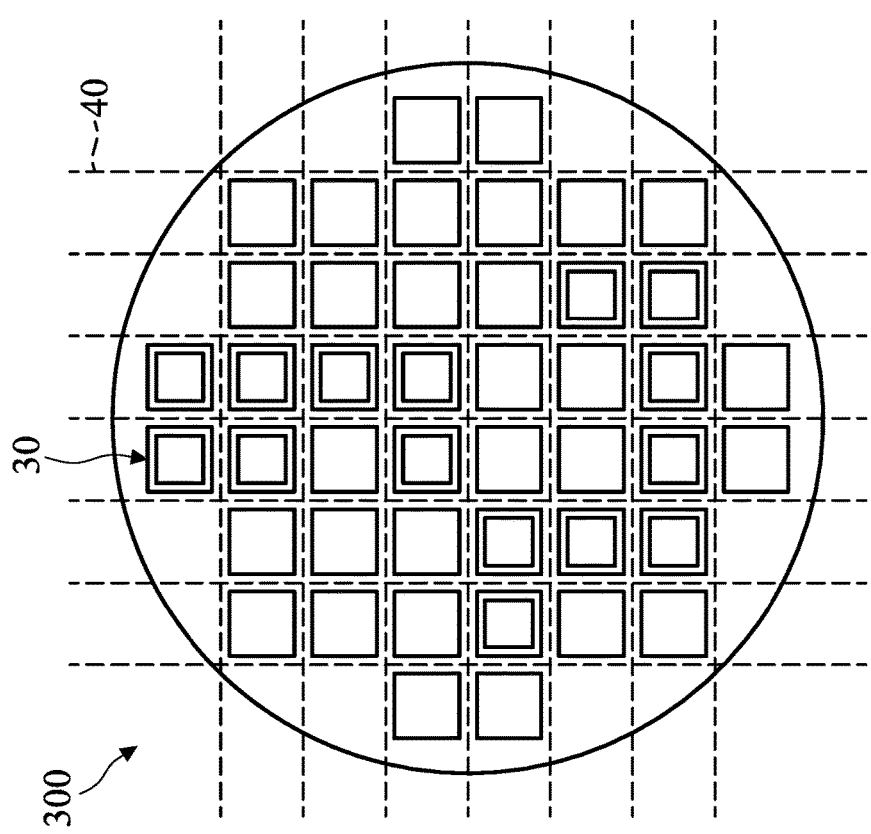
FIG. 2B shows a top-view representation of the die-on-wafer structure, in accordance with some embodiments of the disclosure.

FIG. 2B shows a top-view representation of the die-on-wafer structure 300, in accordance with some embodiments of the disclosure.

After the electrical connector 244 is formed, the second wafer 200 is diced along the scribe lines 40 to form a number of package structures 30. Each package structure 30 includes a first die 10 and a second die 20. Before the dicing process, another function test is performed on the package structure 300 to check the function of the package structure 300.

It should be noted that the first die 10 is self-aligned to the second die 20 by aligning the first magnetic pad 120 and the second magnetic pad 220. Therefore, the accuracy and precision of the alignment is improved. In addition, before the first die 10 is put over the second die 20, the first function test is performed to find many good first dies 10 and many good second dies 20, and the second function test is performed on the die-on-wafer structure 300 before the dicing process. These function tests are used to check the function of the first dies 10 and the second dies 20 to ensure the quality of the first dies 10 and the second dies 20. Therefore, the yield of the package structure 300 is improved.

Figure 3:
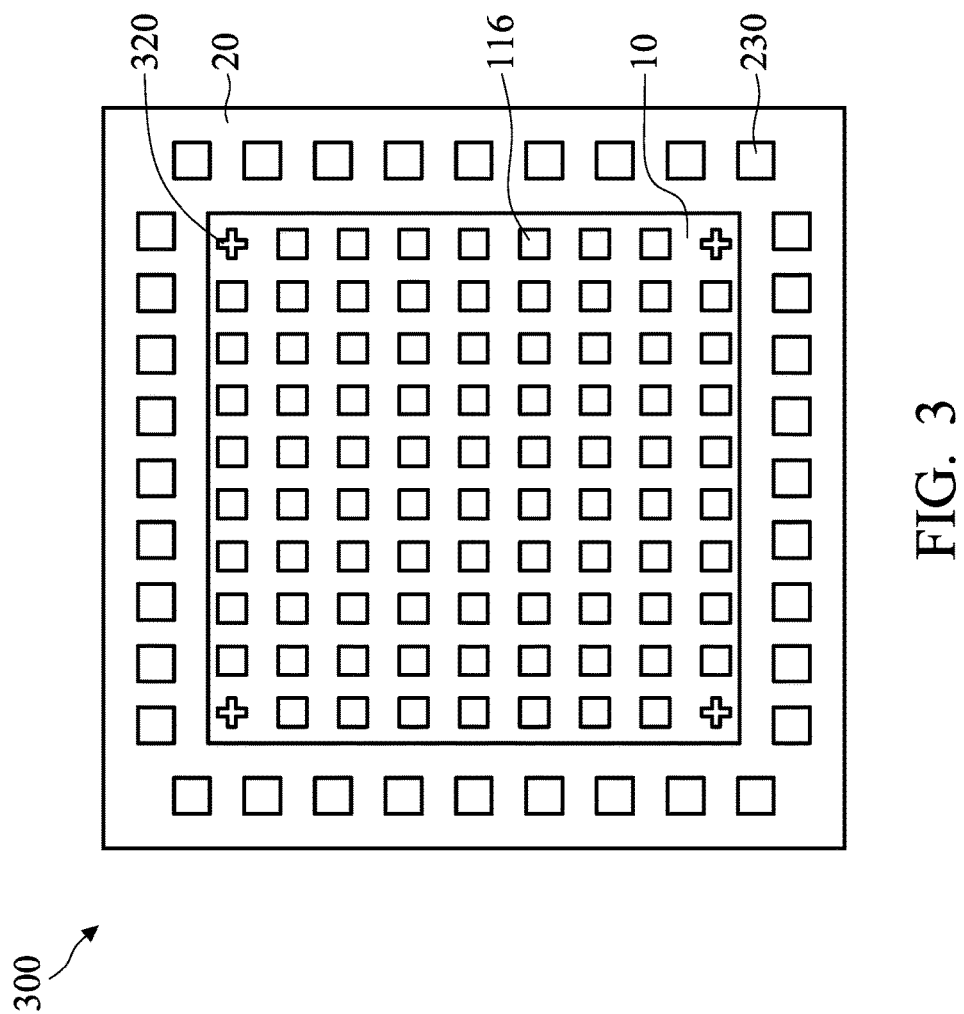
FIG. 3 shows a top-view representation of the package structure, in accordance with some embodiments of the disclosure.

FIG. 3 shows a top-view representation of the package structure 300, in accordance with some embodiments of the disclosure. The magnetic bonding structure 320 is formed at the peripheral region of the first die 10, and the metal layer 116 and the second metal layer 216 are surrounded by the magnetic bonding structure 320. The first die 10 is surrounded by the metal pad 230. The shape of magnetic bonding structure 320 may have cross-shaped structure, rectangular shape or other applicable shapes. The size of the first die 10 is smaller than the second die 20, and therefore the metal pads 230 may connect to the outer devices via the electrical connector 244.

Figure 4A:
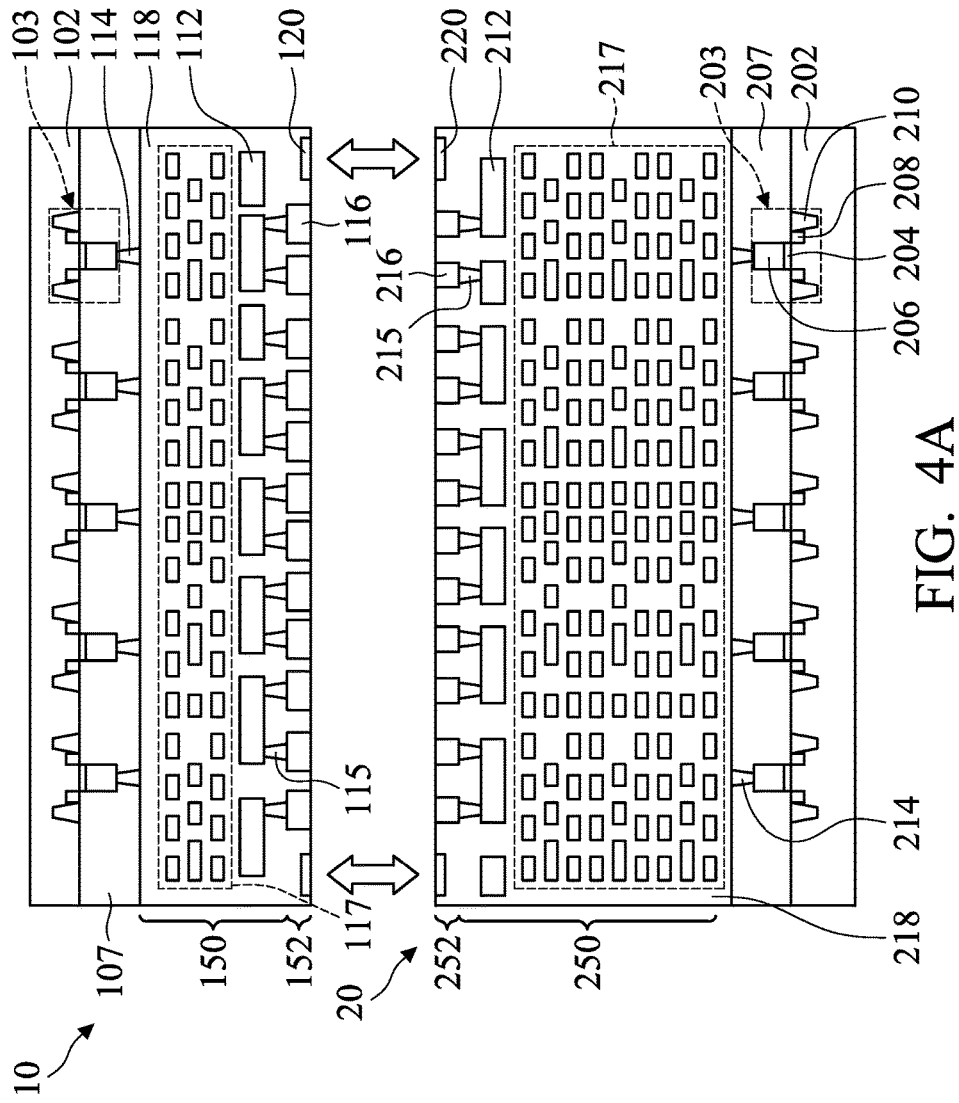
FIGS. 4A-4C show cross-sectional representations of various stages of forming a package structure, in accordance with another embodiment of the disclosure.
Figure 4B:
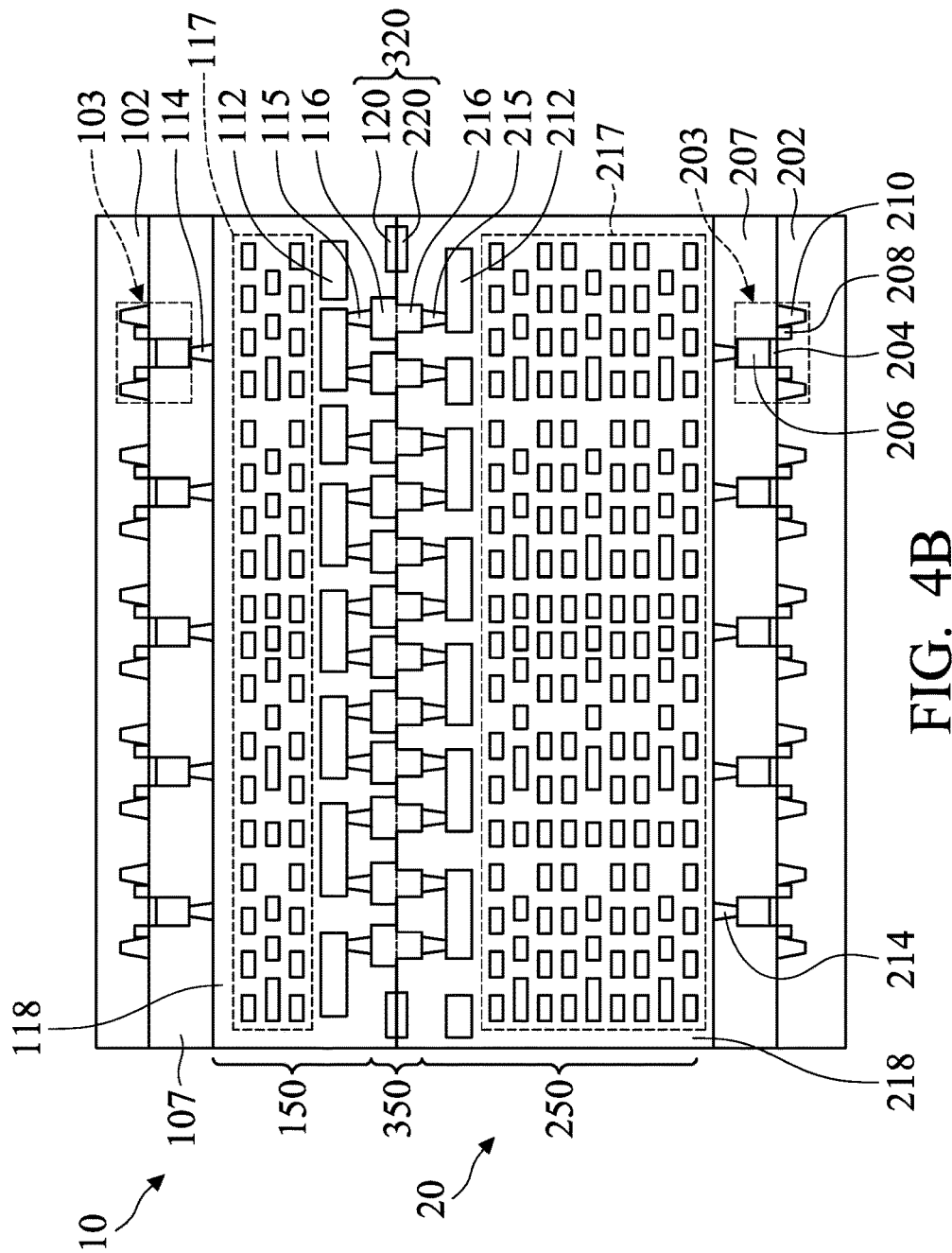
Figure 4C:
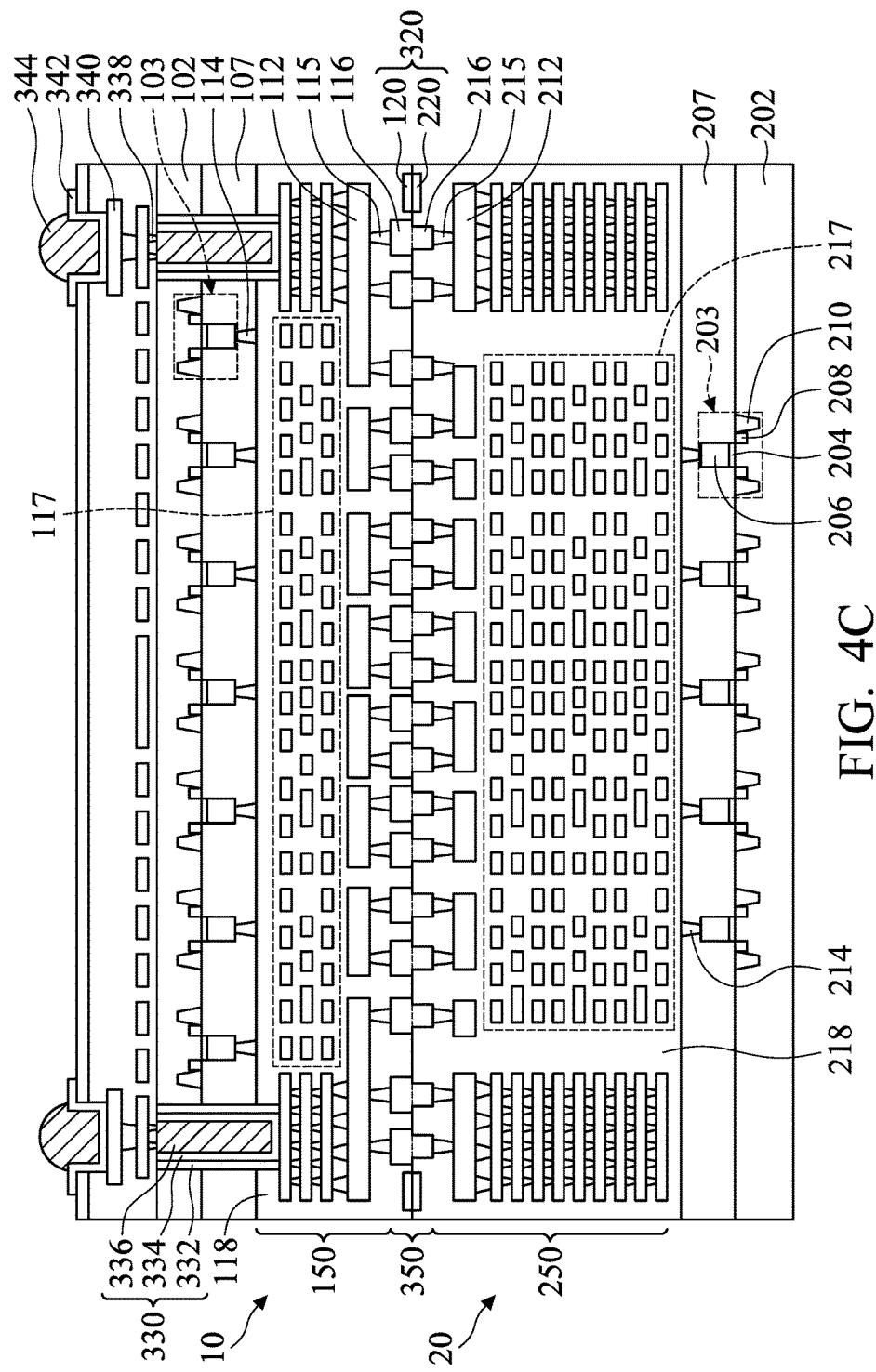

FIGS. 4A-4C show cross-sectional representations of various stages of forming a package structure 30, in accordance with another embodiment of the disclosure.

As shown in FIG. 4A, the first die 10 is similar to, or the same as, the first die 10 shown in FIG. 1E. The second die 20 is similar to, or the same as, the second die 20 shown in FIG. 1E. However, the size of the first die 10 is the same as the size of the second die 20. Processes and materials used to form the first die 10 and the second die 20 in FIG. 2A may be similar to, or the same as, those used to form the first die 10 and the second die 20 in FIG. 1E and are not repeated herein.

Afterwards, the first magnetic pad 120 is self-aligned to the second magnetic pad 220, and a hybrid bonding process is performed on the first die 10 and the second die 20, as shown in FIG. 4B, in accordance with some embodiments of the disclosure. The magnetic bonding structure 320 is formed by the first magnetic pad 120 and the second magnetic pad 220. The hybrid bonding structure 350 is formed between the first interconnect structure 150 and the second interconnect structure 250.

Afterwards, a through substrate via (TSV) structure 330 is formed through the first substrate 102, as shown in FIG. 4C, in accordance with some embodiments of the disclosure. The TSV structure 330 is electrically connected to the first interconnect structure 150.

In some embodiments, the TSV structure 330 includes a liner 332, a diffusion barrier layer 334, and a conductive via material 336. The TSV structure 330 is formed by the following operations. Firstly, a TSV opening is formed through the first substrate 102 by one or more etching processes. After the TSV opening is formed, a liner 332 is formed on sidewalls of the TSV opening to act as an isolation layer such that conductive materials for TSV structure 330 and the first substrate 102 do not directly contact each other. Afterwards, the diffusion barrier layer 334 is conformally formed on the liner 332. The diffusion barrier layer 334 is used to prevent conductive via material 336 which is formed later from migrating to the devices in the first device regions 103 and the second device regions 203. Afterwards, conductive via material 336 is used to fill into the TSV opening.

Afterwards, a via 338 and a pad 340 are formed over the TSV structure 330. An under bump metallization (UBM) layer 342 is formed over the pad 340; and a conductive structure 344 is formed over the UBM layer 342.

In some embodiments, the pad 340 is made of metal materials, such as aluminum (Al). In some embodiments, UBM layer 342 is made of titanium (Ti), titanium nitride (TiN), tantalum nitride (TaN), tantalum (Ta), or the like. In addition, the UBM layer 160 may contain an adhesion layer and/or a wetting layer. In some embodiments, the UBM layer 342 further includes a copper seed layer. The conductive structure 344 is made of conductive materials, such as tin (Sn), copper (Cu), gold (Au), silver (Ag), alloys thereof, or other suitable materials. In some embodiments, a solder paste is used to enhance the adhesive strength between the UBM layer 342 and the conductive structure 344.

The configuration of the TSV structure 330 to increase the number of the I/O electrical connector, and therefore the operation speed of the package structure 30 is improved.

Figure 5:
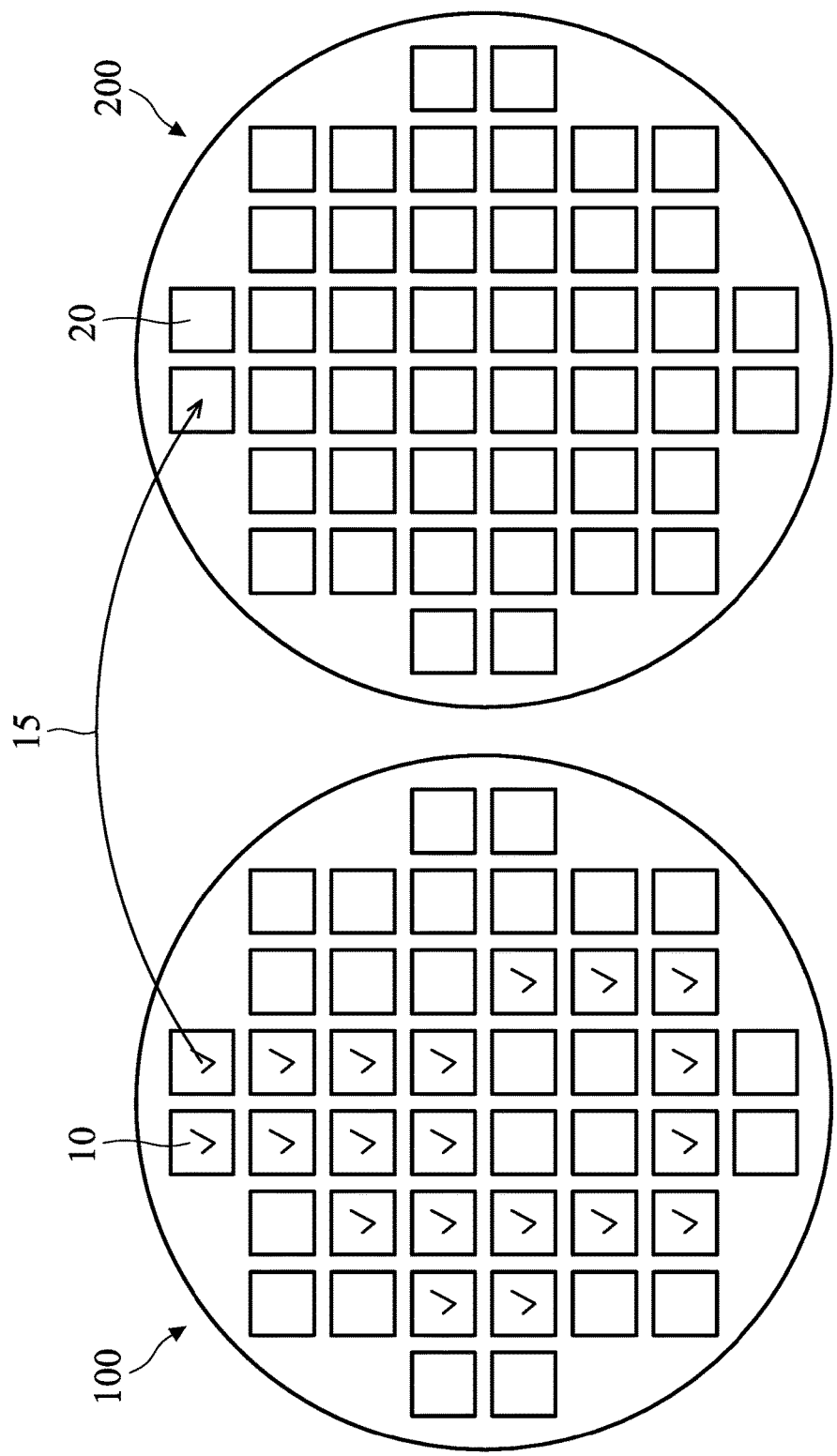
FIG. 5 shows a top-view representation of the first wafer and the second wafer, before a bonding process, in accordance with some embodiments of the disclosure.

FIG. 5 shows a top-view representation of the first wafer 100 and the second wafer 200, before a bonding process, in accordance with some embodiments of the disclosure. The first wafer 100 includes a number of first dies 10, and the second wafer 200 includes a number of second dies 20. It should be noted that the size of the first die 10 is the same as the size of the second die 20. The pick/put machine 15 is used to pick the good first dies 10 on the top of the good second dies 20.

Embodiments for forming a package structure and method for forming the same are provided. The package structure includes a first die and a second die. The first die is firstly put over the second die over a second wafer. The alignment of the first die and the second die is achieved by forming a first magnetic pad in the first die and a second magnetic pad in the second die. The first magnetic pad is self-aligned to the second die via the magnetic force. Therefore, the accuracy and precision of the alignment is improved. Furthermore, the reliability and performance of the package structure are improved.

In some embodiments, a package structure is provided. The package structure includes a first die, and the first die comprises a first magnetic pad formed over a first substrate. The package structure includes a second die, and the second die includes a second magnetic pad formed over a second substrate. The package structure also includes a hybrid bonding structure formed between the first die and the second die of the second wafer. The hybrid bonding structure includes a magnetic bonding structure which is made of the first magnetic pad and the second magnetic layer.

In some embodiments, a package structure is provided. The package structure includes a first interconnect structure formed over a first substrate and a second interconnect structure formed over a second substrate. The package structure also includes a hybrid bonding structure between the first interconnect structure and the second interconnect structure. The hybrid structure includes a magnetic bonding structure made of a first magnetic pad and a second magnetic layer.

In some embodiments, a method for forming a package structure is provided. The method includes receiving the first die, and the first die includes a first magnetic pad formed over a first substrate. The method includes receiving a second wafer, and the second wafer includes a second die, and the second die includes a second magnetic pad formed over a second substrate. The method includes aligning the first die to the second wafer, and the first magnetic pad is self-aligned to the second magnetic layer. The method includes forming a hybrid bonding structure between the first die and the second wafer to form a bonding structure. The hybrid bonding structure includes a magnetic bonding structure which is made of the first magnetic pad and the second magnetic layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a first die, wherein the first die comprises a first bonding structure formed over a first substrate, wherein the first bonding structure comprises a first magnetic pad with an entirely planar top surface and a first metal layer, the first magnetic pad and the first metal layer both are embedded in a first insulating layer;
   a second die, and the second die comprises a second bonding structure formed over a second substrate, wherein the second bonding structure comprises a second magnetic pad with an entirely planar bottom surface and a second metal layer, and the entirely planar top surface of the first magnetic pad is in direct contact with the entirely planar bottom surface of the second magnetic pad, and the second magnetic pad and the second metal layer both are embedded in a second insulating layer; and
   a hybrid bonding structure formed between the first die and the second die by bonding the first bonding structure and the second bonding structure, wherein the hybrid bonding structure comprises a magnetic bonding structure which is made of the first magnetic pad and the second magnetic pad, a metal-to-metal bonding structure and a non-metal-to-non-metal bonding structure, the metal-to-metal bonding structure is constructed by the first metal layer and the second metal layer, and the non-metal-to-non-metal bonding structure is constructed by the first insulating layer and the second insulating layer.

2. The package structure as claimed in claim 1, further comprising:
   a metal pad formed over the second substrate;
   a passivation layer formed over the metal pad, wherein the passivation layer has an opening to expose a portion of the metal pad; and
   an electrical connector formed in the opening, wherein the electrical connector is electrically connected to the metal pad.

3. The package structure as claimed in claim 2, wherein the first die is surrounded by the passivation layer.

4. The package structure as claimed in claim 1, further comprising:
   a through substrate via (TSV) structure formed through the first substrate, wherein the TSV structure is electrically connected to a first interconnect structure over the first substrate.

5. The package structure as claimed in claim 4, further comprising:
   a metal pad formed over the TSV structure;
   an under bump metallization (UBM) layer formed over the metal pad; and
   a conductive structure formed over the UBM layer.

6. The package structure as claimed in claim 1, wherein at least one of the first magnetic pad and the second magnetic pad comprises iron (Fe), cobalt (Co), nickel (Ni) or a combination thereof.

7. The package structure as claimed in claim 1, wherein the first magnetic pad has a first top surface, the first metal layer has a second top surface, and the first top surface is substantially coplanar with the second top surface.

8. A package structure, comprising:
   a first interconnect structure formed over a first substrate;
   a first bonding structure formed over the first interconnect structure, wherein the first bonding structure comprises a first magnetic pad with a first top surface and a first metal layer with a second top surface, and the first top surface is substantially coplanar with the second top surface, and the first magnetic pad and the first metal layer are embedded in a first insulating layer;
   a second interconnect structure formed over a second substrate;
   a second bonding structure formed over the second interconnect structure, wherein the second bonding structure comprises a second magnetic pad with an entirely planar bottom surface and a second metal layer, and the entirely planar top surface of the first magnetic pad is in direct contact with the entirely planar bottom surface of the second magnetic pad; and
   a hybrid bonding structure between the first interconnect structure and the second interconnect structure by bonding the first bonding structure and the second bonding structure, wherein the hybrid structure comprises a magnetic bonding structure and a metal-to-metal bonding structure, wherein the metal-to-metal bonding structure is partially surrounded by the magnetic bonding structure, and the metal-to-metal bonding structure is constructed by the first metal layer and the second metal layer.

9. The package structure as claimed in claim 8, wherein the hybrid bonding structure further comprises a non-metal-to-non-metal bonding structure.

10. The package structure as claimed in claim 9, wherein the second metal layer and the second magnetic pad are embedded in a second insulating layer.

11. The package structure as claimed in claim 8, wherein at least one of the first magnetic pad and the second magnetic pad comprises iron (Fe), cobalt (Co), nickel (Ni) or a combination thereof.

12. The package structure as claimed in claim 8, further comprising:
   a through substrate via (TSV) structure formed through the first substrate, wherein the TSV structure is electrically connected to the first interconnect structure.

13. The package structure as claimed in claim 8, further comprising:
   a first transistor formed over the first substrate; and
   a second transistor formed over the second substrate, wherein a top of the first transistor faces a top of the second transistor.

14. The package structure as claimed in claim 13, wherein the first substrate has a central region and a peripheral region, the first transistor is formed in the central region, and the first magnetic pad is formed in the peripheral region.

15. A package structure, comprising:
   a first substrate having a central region and a peripheral region;

a first transistor formed on the central region of the first substrate;

a through substrate via (TSV) structure formed in the peripheral region of the first substrate;

a second transistor formed over a second substrate, wherein a top of the first transistor faces a top of the second transistor;

a first magnetic pad formed in the peripheral region of the first substrate;

a second magnetic pad formed in a peripheral region of the second substrate, wherein the first magnetic pad is directly overlapping and aligned with the second magnetic pad, and an entirely planar top surface of the first magnetic pad is in direct contact with an entirely planar bottom surface of the second magnetic pad; and a magnetic bonding structure formed between the first magnetic pad and the second magnetic pad.

16. The package structure as claimed in claim 15, wherein the first magnetic pad is formed in a first interconnect structure, the second magnetic pad is formed in a second interconnect structure.

17. The package structure as claimed in claim 16, wherein a hybrid bonding structure is between the first interconnect structure and the second interconnect structure, the hybrid bonding structure comprises a metal-to-metal bonding structure, and the metal-to-metal bonding structure is partially surrounded by the magnetic bonding structure.

18. The package structure as claimed in claim 15, wherein at least one of the first magnetic pad and the second magnetic pad comprises iron (Fe), cobalt (Co), nickel (Ni) or a combination thereof.

19. The package structure as claimed in claim 15, wherein the through substrate via (TSV) structure formed through the first substrate, wherein the TSV structure is electrically connected to a first interconnect structure over the first substrate.

20. The package structure as claimed in claim 19, further comprising:

a metal pad formed over the TSV structure;

an under bump metallization (UBM) layer formed over the metal pad; and a conductive structure formed over the UBM layer.

* * * * *